(12) United States Patent
Low et al.

(10) Patent No.: US 12,167,566 B1
(45) Date of Patent: Dec. 10, 2024

(54) MULTI-FAN COOLED ELECTRONIC CONTROL UNIT ASSEMBLY

(71) Applicant: PlusAI, Inc., Santa Clara, CA (US)

(72) Inventors: Andrew Kin Wei Low, Sunnyvale, CA (US); Murad Mehdi Mohammad Bharwani, Mountain View, CA (US); Riley Walch, Redwood City, CA (US); Sriram Sampath, Fremont, CA (US); Andre Azari, Brentwood, CA (US)

(73) Assignee: PlusAI, Inc., Santa Clara, CA (US)

( * ) Notice: Subject to any disclaimer, the term of this patent is extended or adjusted under 35 U.S.C. 154(b) by 0 days.

(21) Appl. No.: 18/679,958

(22) Filed: May 31, 2024

(51) Int. Cl.
*H05K 7/20* (2006.01)

(52) U.S. Cl.
CPC ..... *H05K 7/20145* (2013.01); *H05K 7/20127* (2013.01)

(58) Field of Classification Search
CPC .............. B60H 2001/003; B60H 1/004; B60H 2001/00614; B60H 1/00564; H05K 7/20272; H05K 7/20327; H05K 7/1432; H05K 7/14322; H05K 7/20145; H05K 7/2089; F28F 3/12; F28F 1/022
See application file for complete search history.

(56) References Cited

U.S. PATENT DOCUMENTS

| | | | | |
|---|---|---|---|---|
| 8,734,212 B2 * | 5/2014 | Peng | ............... | H05K 7/1497 361/695 |
| 2012/0142265 A1 * | 6/2012 | Wei | ............... | H05K 7/20745 454/289 |
| 2013/0240196 A1 * | 9/2013 | Chang | ............... | H05K 7/20745 165/247 |
| 2021/0185862 A1 * | 6/2021 | Nagao | ............... | B60H 1/00271 |

* cited by examiner

*Primary Examiner* — Mandeep S Buttar
(74) *Attorney, Agent, or Firm* — Kilpatrick Townsend & Stockton LLP (57) ABSTRACT

An assembly is described. An assembly can include a housing comprising a first compartment and a plurality of vents letting air flow into and out. The assembly can further include a first ECU positioned within the first compartment, the first ECU comprising a first inlet letting air flow into the first ECU. The assembly can further include a second ECU positioned within the first compartment, the second ECU comprising a second inlet letting air flow into the second ECU. The assembly can further include a first plenum positioned between the first ECU and the second ECU and comprising a second compartment. The assembly can further include a first air duct forming a first channel letting air from a first vent of the plurality of vents into the second compartment, wherein the first plenum further comprises a second vent positioned to align with the first inlet of the first ECU.

18 Claims, 11 Drawing Sheets

MULTI-FAN COOLED ELECTRONIC CONTROL UNIT ASSEMBLY

BACKGROUND

Various vehicles employ computing means to aid a vehicle operation. Recently, in the automotive industry, much of the focus is on using computing means to make a vehicle operate in an autonomous mode.

An electronic control unit (ECU), sometimes referred to as an electronic control module (ECM), is a computing device that can control one or more specific vehicle functions (e.g., engine control, power steering). The ECU can be arranged inside an assembly, in which cool air can be circulated from the ambient environment and through the ECU to regulate the ECU's internal temperature. One issue can be that due to the vehicle's space constraints, adding an additional ECU may require that the size and shape of the housing of the assembly remain the same. Furthermore, the assembly needs be designed such that any additional ECU can also receive cool air from the ambient environment for temperature regulation. Embodiments are directed to address these and other problems, individually and collectively.

BRIEF SUMMARY

Embodiments described herein are directed toward a multi-electronic control unit (ECU) assembly. A multi-ECU assembly can include a housing comprising a first compartment and a plurality of vents letting air flow into and out of the housing. The multi-ECU assembly can further include a first ECU positioned within the first compartment, the first ECU comprising a first inlet letting air flow into the first ECU. The multi-ECU assembly can further include a second ECU positioned within the first compartment, the second ECU comprising a second inlet letting air flow into the second ECU. The multi-ECU assembly can further include a first plenum positioned in the first compartment, the first plenum positioned between the first ECU and the second ECU, the first plenum comprising a second compartment. The multi-ECU assembly can further include a first air duct forming a first channel letting air from a first vent of the plurality of vents into the second compartment, wherein the first plenum further comprises a second vent positioned to align with the first inlet of the first ECU.

Embodiments can include a multi-ECU assembly. The multi-ECU assembly can include a first ECU, the first ECU comprising a first inlet for letting air flow into the first ECU. The multi-ECU assembly can further include a second ECU, the second ECU comprising a second inlet for letting air flow into the second ECU. The multi-ECU assembly can further include a plenum comprising a second compartment, the plenum positioned between the first ECU and the second ECU. The multi-ECU assembly can further include a first air duct forming a first channel for letting air flow into the second compartment, wherein the plenum further comprises a first vent positioned to align with a position of the first inlet of the first ECU.

Embodiments can further include a method for assembling a multi-ECU assembly. The method can include providing a first ECU, a second ECU, a plenum. The method can further include forming a first inlet on a front surface of the first ECU. The method can further include positioning the first ECU in a first compartment of a housing. The method can further include forming a first vent on the plenum. The method can further include positioning the plenum proximate to the first ECU in the first compartment by aligning the first vent of the plenum with the first inlet of the first ECU. The method can further include forming a second inlet on a front surface of the second ECU. The method can further include positioning the second ECU in the first compartment proximate to the plenum such that the plenum is provided between the first ECU and the second ECU, and the front surface of the second ECU faces away from the plenum. The method can further include connecting a first surface of the plenum to a first air duct that permits a flow of air from an ambient environment into the first inlet via a body of the plenum, wherein the first surface of the plenum faces away from the front surface of the first ECU.

Other embodiments of this aspect include corresponding computer systems, apparatus, and computer programs recorded on one or more computer storage devices, each configured to cause the actions of the method.

Further details regarding embodiments can be found in the Detailed Description and the Figures.

DETAILED DESCRIPTION

In the following description, various embodiments will be described. For purposes of explanation, specific configurations and details are set forth to provide a thorough understanding of the embodiments. However, it will also be apparent to one skilled in the art that the embodiments may be practiced without the specific details. Furthermore, well-known features may be omitted or simplified in order not to obscure the embodiment being described.

Prior to discussing embodiments, some terms can be described in further detail.

As used herein, a "vehicle" may include, for example, a fully autonomous vehicle, a partially autonomous vehicle, a vehicle with driver assistance, or an autonomous capable vehicle. The capabilities of autonomous vehicles can be associated with a classification system or taxonomy having tiered levels of autonomy. A classification system can be specified by, for example, industry standards or governmental guidelines. For example, the levels of autonomy can be considered using a taxonomy such as level 0 (momentary driver assistance), level 1 (driver assistance), level 2 (additional assistance), level 3 (conditional assistance), level 4 (high automation), and level 5 (full automation without any driver intervention). Following this example, an autonomous vehicle can be capable of operating, in some instances, in at least one of levels 0 through 5. According to various embodiments, an autonomous capable vehicle may refer to a vehicle that can be operated by a driver manually (that is, without the autonomous capability activated) while being capable of operating in at least one of levels 0 through 5 upon activation of an autonomous mode.

As used herein, the term "driver" may refer to a local operator (e.g., an operator in the vehicle) or a remote operator (e.g., an operator physically remote from and not in the vehicle). The autonomous vehicle may operate solely at a given level (e.g., level 2 additional assistance or level 5 full automation) for at least a period of time or during the entire operating time of the autonomous vehicle. Other classification systems can provide other levels of autonomy characterized by different vehicle capabilities.

A "vehicle computer" may include one or more processors and a memory. A "processor" may include any suitable data computation device or devices. A processor may comprise one or more microprocessors working together to accomplish a desired function. A "memory" may be any suitable device or devices that can store electronic data. A suitable memory may comprise a non-transitory computer readable medium that stores instructions that can be executed by at least one processor to implement a desired method. Examples of memories may comprise one or more memory chips, disk drives, etc. Such memories may operate using any suitable electrical, optical, and/or magnetic mode of operation.

Details of some embodiments will now be described in greater detail.

An electronic control unit (ECU) can be harnessed to a vehicle's sensors, actuators, and other computing devices to control the vehicle's functioning. The harnessing can be a set of wires or other connectors that connect the ECU to various vehicle components. A vehicle can include multiple ECUs to control various vehicle functions. An ECU can include a dedicated chipset and software. Each ECU can receive inputs from various vehicle components. For example, an ECU in change of anti-lock braking system can receive inputs from the vehicle's brakes. The ECU can process information and output control instructions (e.g., control instructions for an actuator) to control some specific vehicle function. Each ECU can include thousands of transistors that require electricity to function. As electricity flows through the transistors, the ECU can heat up. If the ECU temperature rises too high or is high enough for an extended duration, the ECU may begin to malfunction. Therefore, an ECU can include a fan unit that can draw cooler air from the ambient environment. The air can circulate throughout the ECU collecting the heat, and the hotter air can be expelled from the ECU.

In a vehicle, a conventional ECU can be part of an assembly that includes various other electronic components. In order for the ECU assembly to function properly, the ECU and the electronic components may need to be arranged in a particular manner. The ECU and electronic components arranged in this manner can occupy a large amount of space in an ECU assembly housing. As vehicles become more complex, it may be necessary to add more ECUs, or it may be advantageous to arrange multiple ECUs in the same location. The conventional ECU assembly can permit a single ECU to receive cool air from the ambient environment and expel hotter air. However, adding an additional ECU can create issues for channeling cooler air to the additional ECU. One solution can be to increase the size of the housing. However, this solution causes the ECU assembly to occupy more space in the vehicle.

Embodiments herein address the above referenced issues by providing techniques to add one or more additional ECUs into an existing ECU assembly, while providing a channel for cooling air to pass to each additional ECU. As described herein, ECUs can be arranged side by side, where the pair of ECUS is separated by a plenum. One ECU of the pair of ECUS can receive cooling from the ambient environment as the air enters the ECU assembly housing. Additionally, an air duct can be arranged inside the housing to guide cooling air from the ambient environment into the plenum. The cooling air can accumulate inside the plenum. The plenum can include a vent that corresponds to a fan inlet of the other ECU of the pair of ECUs. The other ECU can monitor it temperature to determine when to activate its fan unit. As the other ECU activates its fan unit, the cool air that has accumulated inside the plenum can be drawn into the other ECU. This other ECU can then expel warm air from a vent in the housing.

Figure 1:
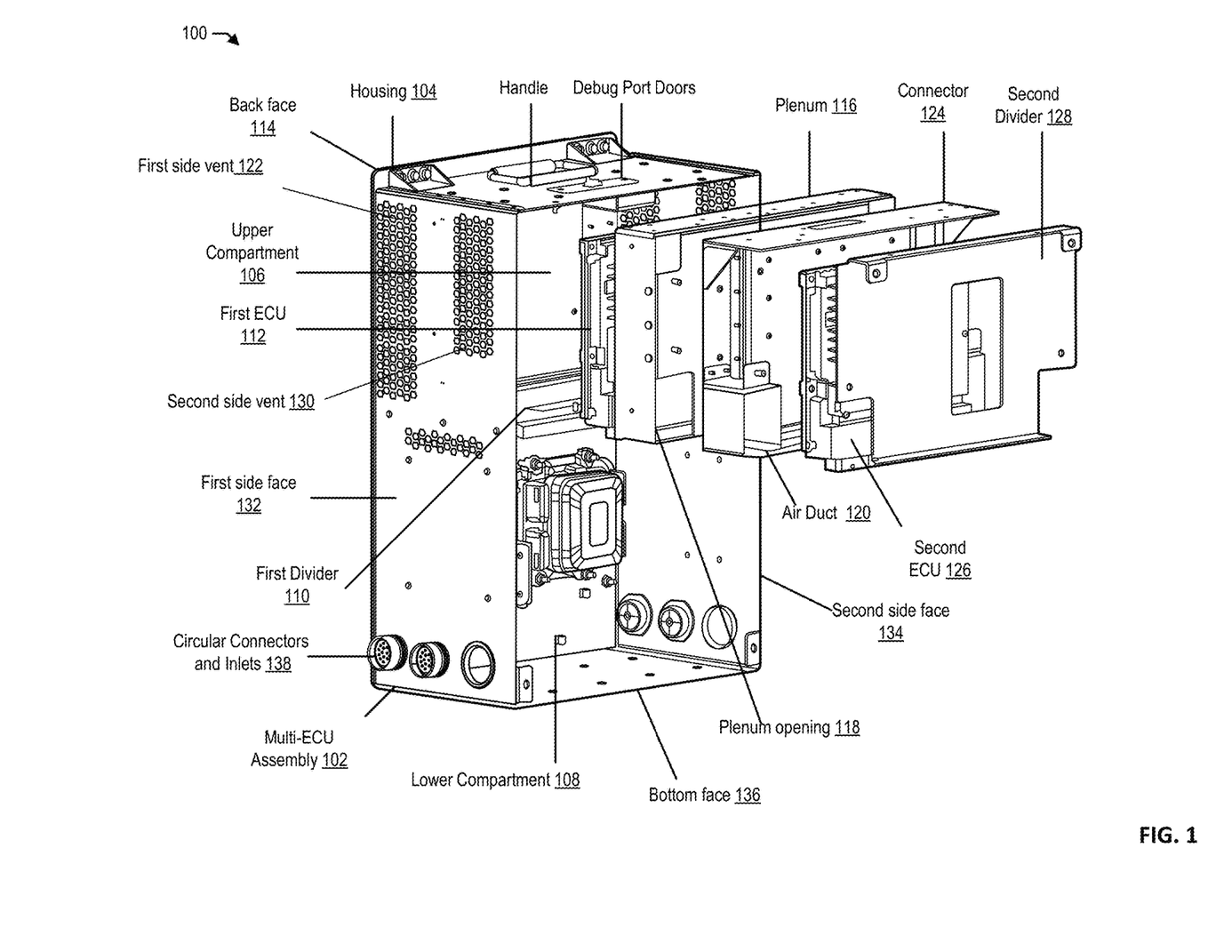
FIG. 1 is an illustration of an exploded view of an example multi-ECU assembly, according to one or more embodiments.

FIG. 1 is an illustration 100 of an exploded view of an example multi-ECU assembly, according to one or more embodiments. The multi-ECU assembly 102 can include a housing 104 that includes an upper compartment 106 and a lower compartment 108 that are separated by a first divider 110. Each of the upper compartment 106 and lower compartment 108 can include a respective volume for arranging various components of the multi-ECU assembly 102. A first ECU 112 can be arranged in the upper compartment 106 against a back face 114 of the housing 104. The first ECU 112 can rest on the first divider 110 and be affixed to the housing 104 via a fastener, such as an adhesive, a bolt, or a screw.

A plenum 116 can be arranged in the upper compartment 106 and next to the first ECU 112. The plenum 116 can generally have a rectangular prism shape. The plenum 116 can include a compartment that provides a volume for accumulating cool air. A first face of the plenum 116 can include at least one plenum vent 118 for receiving cool air. As illustrated, the arrangement of the plenum vent 118 can align with an air duct 120. As illustrated the plenum vent 118 is positioned on a lower left hand side of the plenum 116. It should be appreciated that in other embodiments, the plenum vent 118 can be positioned at various other locations on the plenum 116. The first face of the plenum 116 can include multiple vents. For example, the first face can include a second plenum vent at a lower right side of the first face. The position of the second plenum vent can align with another air duct. A second face of the plenum can include another vent (e.g., a third plenum vent, where the second face is opposite the first face). The third plenum vent can be positioned to align with an inlet of the first ECU 112. A channel can be formed from a vent at the housing 104, through the air duct 120 and into the plenum 116.

The plenum 116 can be fabricated from various materials, including metals, plastics, and composite materials. As indicated above, the plenum 116 can have rectangular prism shape formed from six generally flat faces. The plenum's dimensions can be configurable based on the number of ECUs to be arranged inside the housing 104. The plenum's dimensions can also be configurable based on a desired volume. For example, the plenum's dimensions can be based on the desired amount of air to accumulate inside the volume. In some instances, the plenum's dimensions can be based on multiple considerations (e.g., desired number of ECUs in housing and desired volume). For example, the more ECUs that are to be arranged in the housing 104, the smaller the dimensions of the plenum 116.

Air from outside of the multi-ECU assembly 102 (e.g., ambient environment) can enter the housing 104 through a vent. The housing vent is described with more particularity with respect to FIGS. 8 and 9. The air can pass through the air duct 120 and accumulate in the plenum 116. The first ECU 112 can include circuitry for monitoring an internal temperature. If the first ECU 112 determines that its temperature has exceeded a threshold, the first ECU 112 can cause a fan unit to be activated and draw in air from the plenum 116 and into the first ECU 112. The air can pass through the first ECU 112 can collect heat. The warmer air can be expelled from the first ECU 112 and out of the housing 104 through a vent. For example, the hotter air can be expelled from the first housing side vent 122. As used herein, a vent can be considered a vent. The air flow from the ambient environment and through the plenum vent 118, a second plenum vent, and a third plenum vent is described with more particularity with respect to FIGS. 2 and 7.

The air duct 120 can be affixed to a connector 124 via a fastener, such as an adhesive, bolt, or screw. The connector 124 can be a structure providing support for the air duct 120. The connector 124 can be, for example, a bracket. The connector 124 can be affixed to the plenum 116 via a fastener, such as an adhesive, bolt, or screw.

A second ECU 126 can be arranged in the upper compartment 106 next to the connector 124. The second ECU 126 can be the same type of ECU as the first ECU. Or the second ECU 126 can be a different type of ECU than the first ECU 112. The second ECU 126 can rest on the first divider 110 similarly to the first ECU 112. The second ECU 126 can be separated from a front face of the housing 104 by a second divider 128. The front face is described with more particularity with respect to FIGS. 8 and 9. The second divider 128 can include a vent for allowing air to pass through into an inlet of the second ECU 126. The second ECU 126 can receive air from the ambient environment and the air can pass through the second ECU 126. As the air passes through the second ECU 126, the heat from the second ECU 126 can be transferred to the air. The warmer air can be expelled from the second ECU 126 and out of the housing 104 through the second housing side vent 130. The first housing side vent 122 and the second housing side vent 130 can be positioned on a first side face 132 of the housing 104. The first side face 132 can be opposite a second side face 134. The first side face 132 can be connected to the second side face 134 via a bottom face 136. The second side face 134 can also include vents for expelling warmer air from the first ECU 112 and second ECU 126. The first side face 132 and the second side face 134 can each include a respective set of circular connectors and inlets 138. The lower compartment 108 is described with more particularity with respect to FIG. 5.

Figure 2:
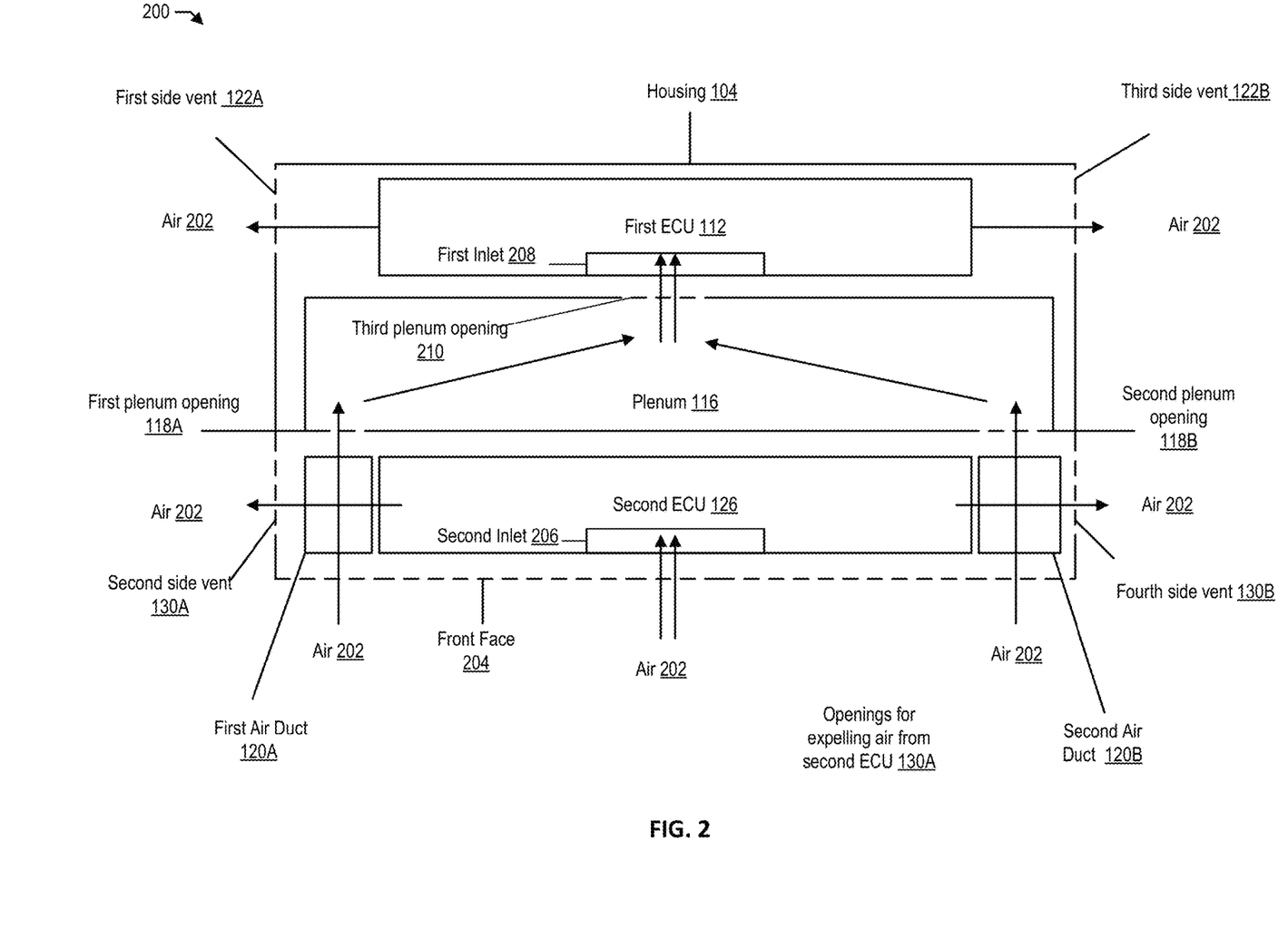
FIG. 2 is an illustration of a plan view of a cross-section of an example multi-ECU assembly, according to one or more embodiments.

FIG. 2 is an illustration 200 of a plan view of a cross-section of an example multi-ECU assembly, according to one or more embodiments. As described with respect to FIG. 1, air 202 can flow into the housing 104 of the multi-ECU assembly. The air 202 can travel inside a first ECU 112 and a second ECU 126 collecting heat from each ECU. The air 202 can then be expelled from each ECU and released from the housing 104 and back into the ambient environment.

The air 202 from the ambient environment can pass through vents of a front face 204 of the housing 104. The air 202 can be received at a second inlet 206 of a second ECU 126. For example, the second ECU 126 can include a fan for drawing in air 202 from the ambient environment. The air 202 can pass through the second ECU 126, and heat from the second ECU 126 can be collected by the air 202. The second ECU 126 can expel the air from an outlet and the expelled air 202 can be released back into the ambient environment via a second housing side vent 130A (e.g., second housing side vent 130) and a fourth housing side vent 130B. It should be appreciated that although the expelled air 202 appears to move through the first air duct 120A and the second air duct 120B, as seen in FIG. 1, the second housing side vent 130 is positioned above the air duct 120 (e.g., first air duct 120A, second air duct 120B). Therefore, in some embodiments, the air 202 can be expelled from the second ECU 126 and pass over the air duct 120A, 120B and be released through the second housing side vent 130A and fourth housing side vent 130B and into the ambient environment.

The air 202 can also pass through one or more air ducts (e.g., first air duct 120A and a second air duct 120B). As illustrated, in some embodiments, the second airduct 120B can be located at an opposite end of the connector 124 as the first airduct 120A. For example, air 202 can pass through the first air duct 120A and into the plenum 116 via a first plenum vent 118A. The air 202 can also pass through the second air duct 120B and into the plenum 116 via a second plenum vent 118B. The air 202 can collect in the compartment of the plenum 116 until it is needed by the first ECU 112. From time to time, the first ECU 112 can activate a fan to draw in air from the plenum 116 via a first inlet 208. The air 202 can pass through the first ECU 112, and heat from the first ECU 112 can be collected by the air 202. The first ECU 112 can expel the air from an outlet and the expelled air 202 can be released back into the ambient environment via a first housing side vent 122A (e.g., first housing side vent 122) and a third housing side vent 122B.

As illustrated, the herein described embodiments, describe techniques for channeling air 202 from the ambient environment and to the first ECU 112. In particular, a first channel can be formed to allow air 202 to pass through the first air duct 120A and into the plenum 116 via the first plenum vent 118A. This air 202 from this first channel can further be drawn into the first ECU 112 via a third plenum vent 210 and the first inlet 208. As indicated above, in some embodiments, the multi-ECU assembly can include multiple air ducts. Therefore, a second channel can be formed to allow air 202 to pass through the second air duct 120B and into the plenum 116 via the second plenum vent 118B. This air 202 from this second channel can combine with the air 202 from the first channel and further be drawn into the first ECU 112 via a third plenum vent 210 and the first inlet 208.

Figure 3:
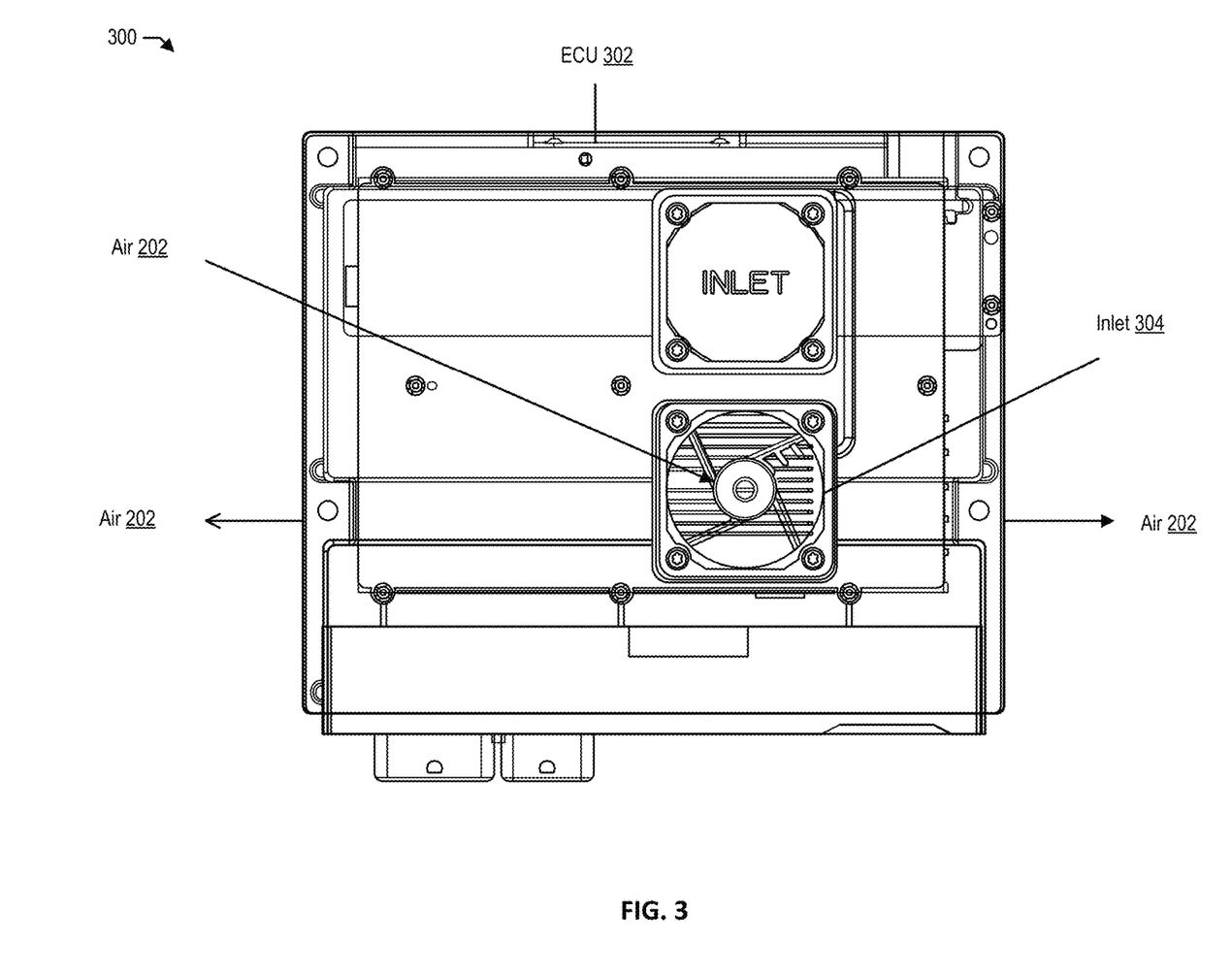
FIG. 3 is an illustration of an example ECU, according to one or more embodiments.
Figure 4:
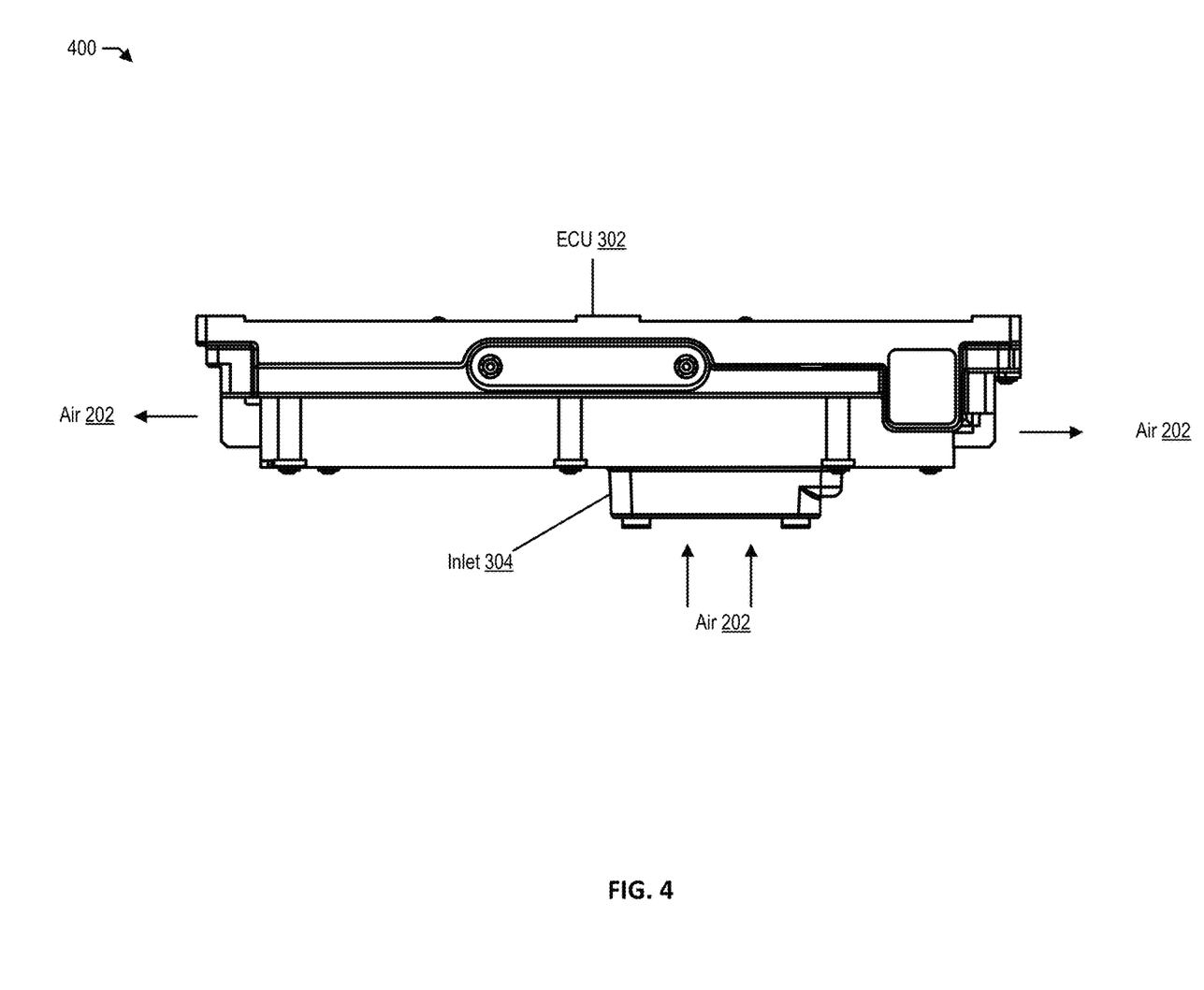
FIG. 4 is an illustration of an example multi-ECU assembly, according to one or more embodiments.

FIGS. 3 and 4 are illustrations of an example ECU from different viewpoints. FIG. 3 is an illustration 300 of an example ECU, according to one or more embodiments. In particular, FIG. 3 is a side view of the example ECU 302. The ECU 302 can be, for example, the first ECU 112 or the second ECU 126, or subsequent ECU that is arranged in a housing (e.g., housing 104) of a multi-ECU assembly. The ECU 302 can include an inlet 304 with a fan module for drawing in air 202. Based on whether the ECU 302 is a first ECU 112, second ECU 126, or subsequent ECU, the position of the inlet 304 can align with other elements of the multi-ECU assembly. For example, if the ECU 302 is a first ECU 112, the inlet 304 can be a first inlet 208 and be aligned with a third plenum vent 210. The alignment can be a vertical alignment and horizontal alignment between the inlet 304 and the third plenum vent 210. If the ECU 302 is a second ECU 126, the inlet 304 can be a second inlet 206 and be aligned with a vent of a second divider 128 and/or a vent of a front face of the housing 104. If the ECU 302 is a subsequent ECU (e.g., a third ECU), the inlet 304 can be a subsequent inlet (e.g., a third inlet) and be aligned with n vent of a subsequent plenum (e.g., a second plenum). This embodiment is described with more particularity with respect to FIG. 7.

FIG. 4 is an illustration 400 of an example multi-ECU assembly, according to one or more embodiments. In particular, FIG. 4 is a top view of the example ECU 302. As illustrated, air 202 can be received at an inlet 304 of the ECU 302. After the air 202 has passed through the ECU 302, the warmer air 202 can be expelled from the sides of the ECU 302.

Figure 5:
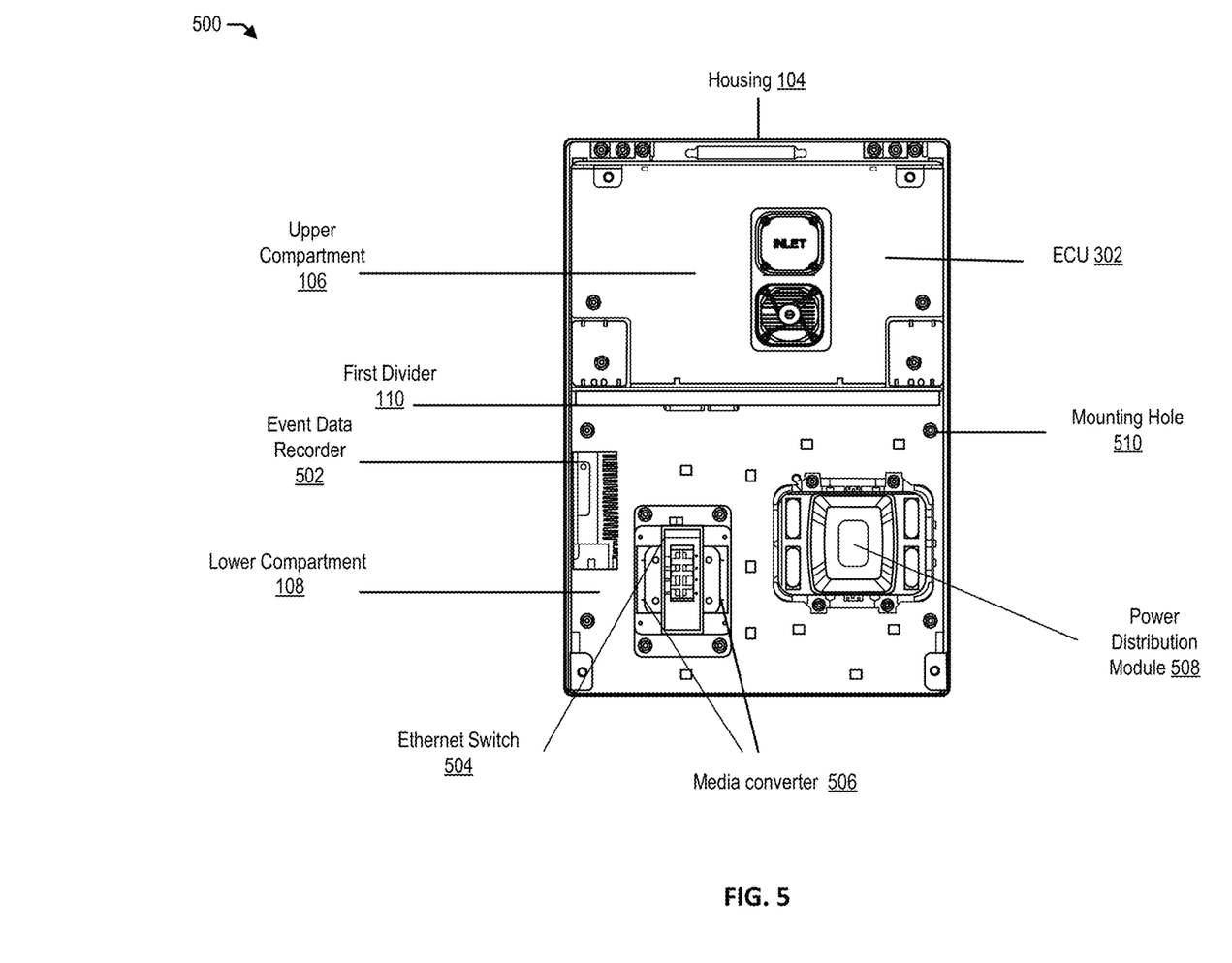
FIG. 5 is an illustration of an example multi-ECU assembly, according to one or more embodiments.

FIG. 5 is an illustration 500 of an example multi-ECU assembly, according to one or more embodiments. FIG. 5 is helpful to illustrate ECU components that can be included in the lower compartment 108. As indicated with respect to FIG. 1, the housing 104 can form an upper compartment 106 and a lower compartment 108 separated by a first divider 110. The upper compartment can include one or more ECUs 302. The lower compartment 108 can include various components that can be used for the functionality of an ECU assembly. For example, the lower compartment 108 can include an event data recorder 502 for collecting data related to the operation of the AV, such as speed, light usage, safety belt usage, and other appropriate information. The lower compartment 108 can include an ethernet switch 504 for connecting the ECU assembly to a computing network, such as a local AV network. The lower compartment 108 can further include a media converter 506 for converting ethernet or other communication protocols from one medium to another medium (e.g., cable type). The lower compartment 108 can further include a power distribution module 508 for being a power source for the ECU assembly. The housing 104 can further include mounting holes 510 for inserting a fastener in to mount the ECU assembly to an AV. It should be appreciated that in some instances, the compartment 108 includes the ECU 302 and the upper compartment 106 includes the event data recorder 502, the ethernet switch 504, the media converter 506, and the power distribution module 508.

Figure 6:
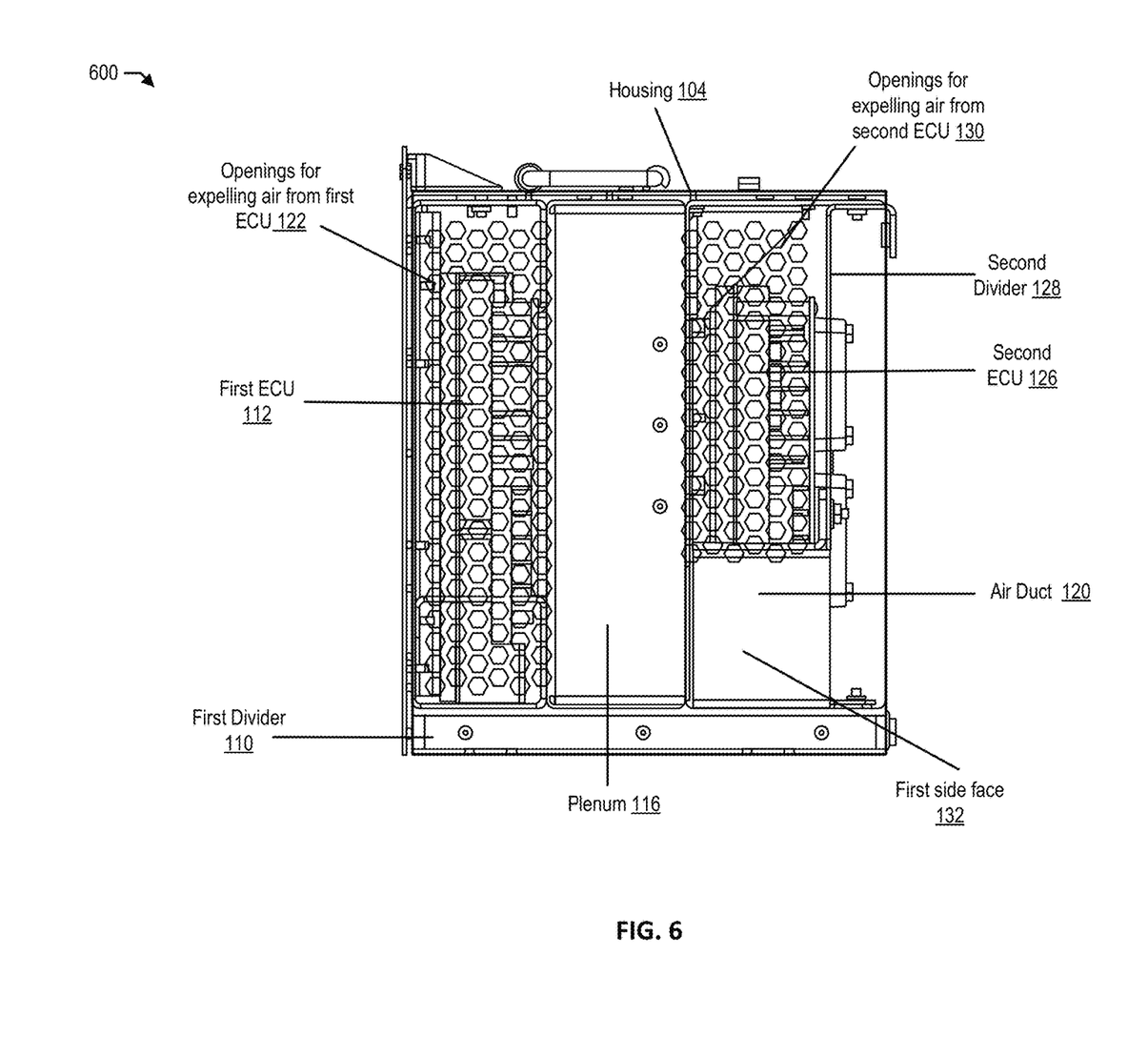
FIG. 6 is an illustration of an example multi-ECU assembly, according to one or more embodiments.

FIG. 6 is an illustration 600 of an example multi-ECU assembly, according to one or more embodiments. In particular, FIG. 6 is an illustration of a side view of the upper compartment of the multi-ECU assembly. For illustration purposes, a first side face 132 of the housing 104 is transparent to show some components behind the first side face 132. As illustrated, the first side face 132 includes a first housing side vent 122 and second housing side vent 130. Behind the first side face are a first ECU 112 and a second ECU 126 separated by a plenum 116. The first ECU 112, the plenum 116, and the second ECU 126 can rest on a first divider 110. An air duct 120 is arranged resting on the first divider 110 and adjacent to the first side face 132 and the plenum 116. Air can travel from outside the housing 104 and through the air duct 120 into the plenum 116 via a plenum vent (e.g., plenum vent 118). The air can then pass through a third plenum vent (e.g., third plenum vent 210) and into the first ECU 112. The second ECU 126 can expel warm air to the ambient environment via the second housing side vent 130. The first ECU 112 can expel warm air into the ambient environment through the first housing side vent 122.

Figure 7:
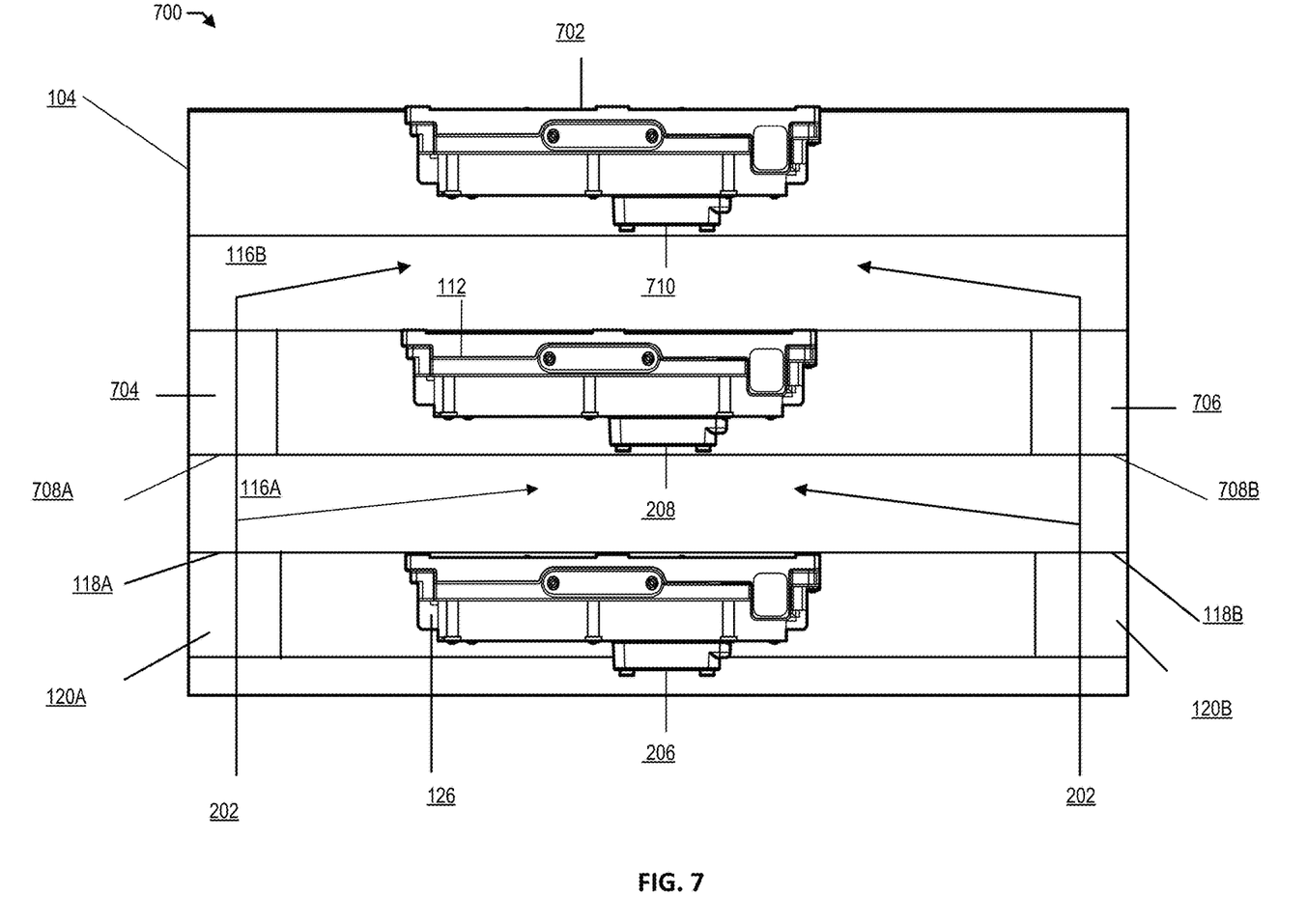
FIG. 7 is an illustration of a plan view of a cross-section of an example multi-ECU assembly, according to one or more embodiments.

FIG. 7 is an illustration 700 of a plan view of a cross-section of an example multi-ECU assembly, according to one or more embodiments. As indicated above, the embodiments herein are not limited to a multi-ECU assembly with two ECUs. Rather more than two ECUs can be arranged inside a housing. As illustrated, a first ECU 112, a second ECU 126, and a third ECU 702 or more ECUs can be arranged in a housing. The first ECU 112 can be arranged apart from the second ECU 126 via a first plenum 116A (e.g., plenum 116). The third ECU 702 can be arranged apart from the first ECU 112 via a second plenum 116B. The second plenum 116B can structurally the same as the first plenum 116A. Furthermore, as illustrated, the second ECU 126 can be arranged to align with a first air duct 120A and a second air duct 120B. The first ECU 112 can be arranged to align with a third air duct 704 and a fourth air duct 706.

Air 202 can travel from the ambient environment into a second inlet 206 of the second ECU 126. As described in FIG. 2, the air 202 can travel through the second ECU 126 collecting heat and be expelled from the housing 104 and into the ambient environment. Air 202 can also travel through the first air duct 120A and the second air duct 120B and into the first plenum 116A via the first plenum vent 118A and the second plenum vent 118B. Air 202 in the first plenum 116 can travel into the first inlet 208 of the first ECU 112. As described in FIG. 2, the air 202 can travel through the first ECU 112 collecting heat and be expelled from the housing 104 and into the ambient environment.

Air can also travel from the ambient environment, through the first air duct 120A and second air duct 120B and through a third air duct 704 and fourth air duct 706. In this embodiment, the second plenum 116B can include a third plenum vent 708A and a fourth plenum vent 708B. The third plenum vent 708A can be located on a opposite face of the first plenum 116A at the first plenum vent 118A. The fourth plenum vent 708B can be located on a opposite face of the first plenum 116A at the second plenum vent 118B. The third plenum vent 708A can be aligned with the first plenum vent 118A. For example, both the third plenum vent 708A and the first plenum vent 118A can be located proximate to a first divider (e.g., the first divider 110) and a first side face (e.g., first side face 132). The fourth plenum vent 708B can be aligned with the second plenum vent 118B. For example, both the fourth plenum vent 708B and the second plenum vent 118B can be located proximate to a first divider (e.g., the first divider 110) and a second side face (e.g., second side face 134).

The air can travel from the third air duct 704 and the fourth air duct 706 into the second plenum 116B. The second plenum 116B can include a compartment that provides a volume for accumulating cool air. The air 202 in the second plenum 116B can travel into a third inlet 710 of the third ECU 702. Similar to the description in FIG. 2, the air 202 can travel through the third ECU 702 collecting heat and be expelled from the housing 104 and into the ambient environment.

It should be appreciated that, space permitting, additional ECUs can be arranged inside the housing 104. Furthermore, the techniques described herein describe channels to permit cool air from the ambient environment to reach an inlet of each additional ECU.

Figure 8:
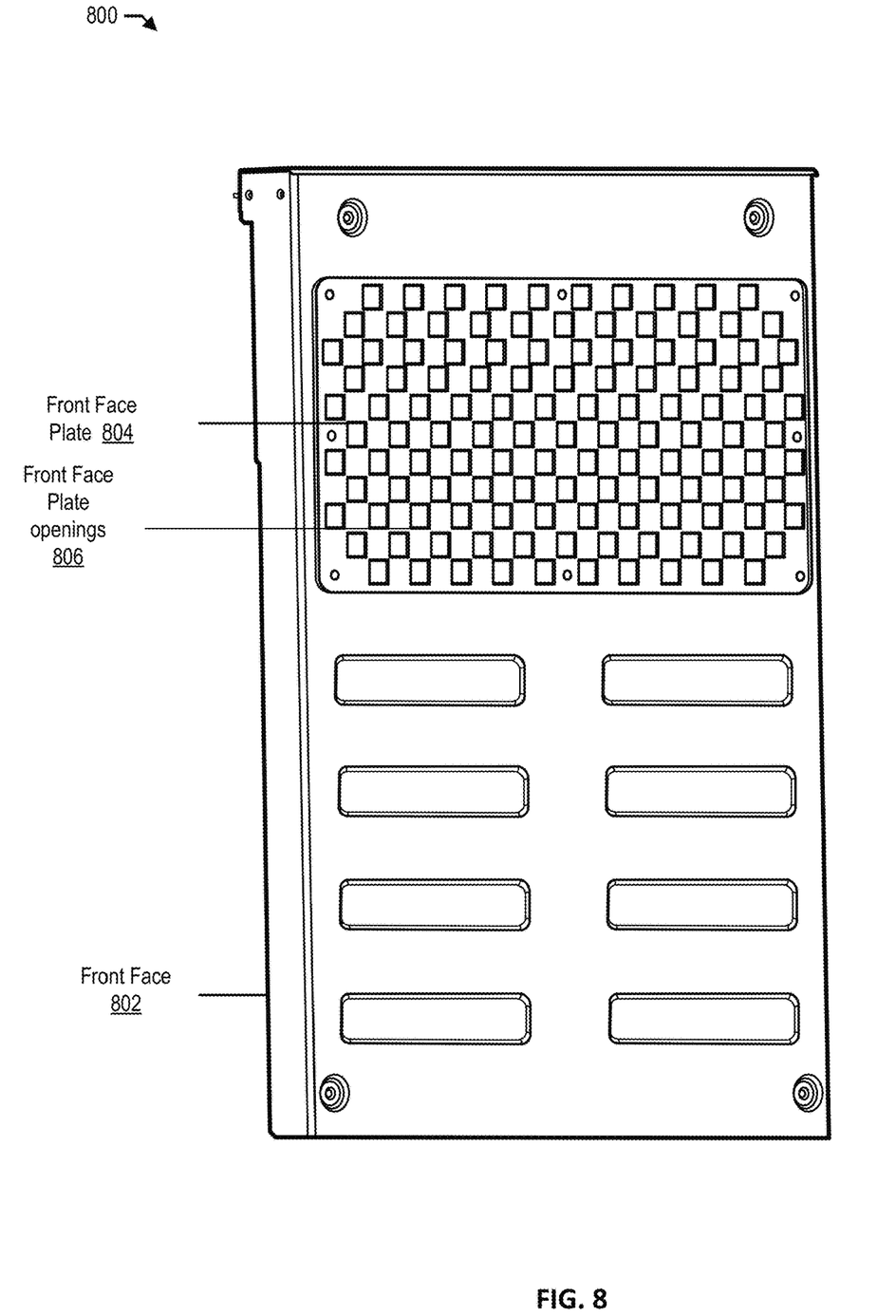
FIG. 8 is an illustration of a face plate and front face of an example multi-ECU assembly, according to one or more embodiments.
Figure 9:
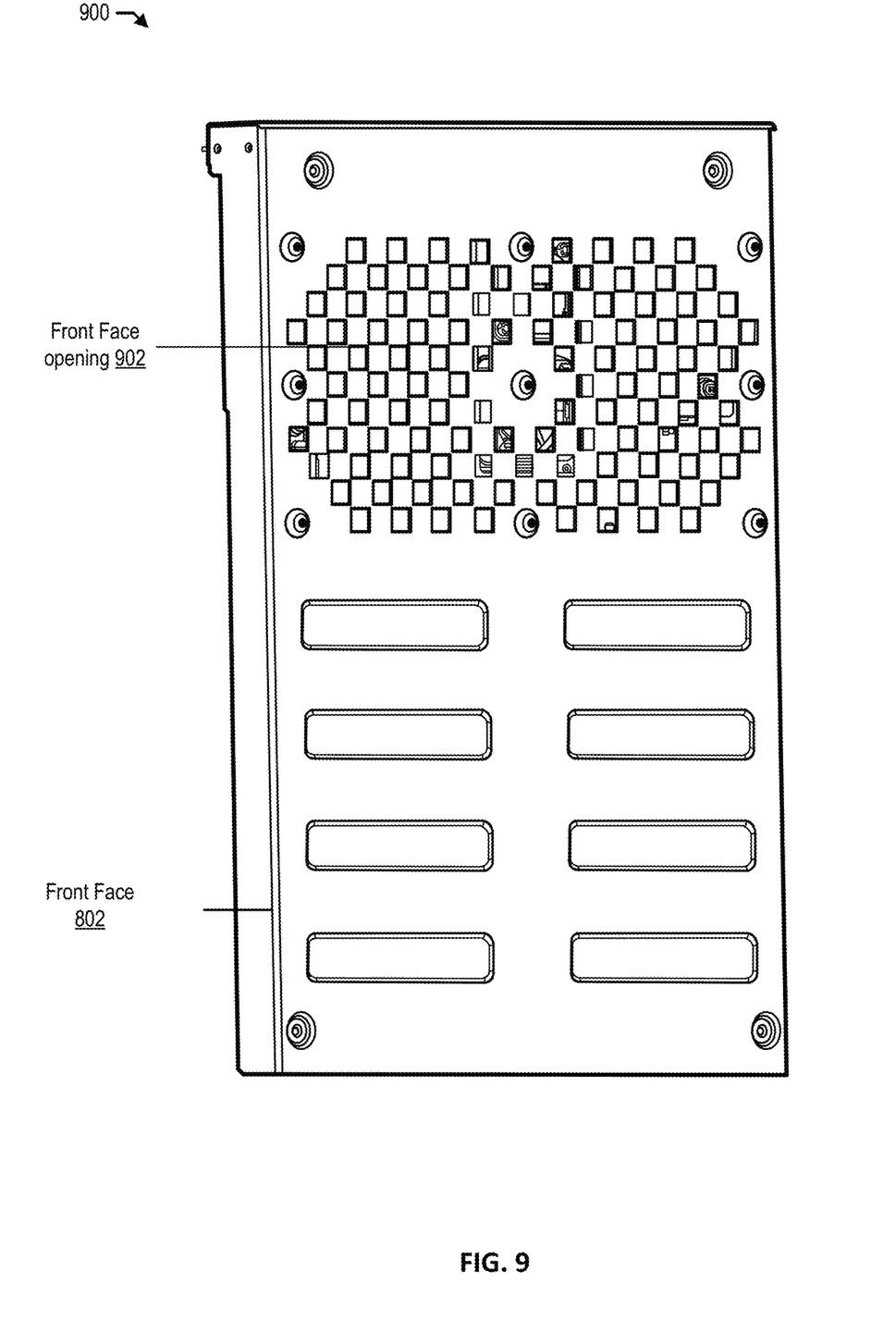
FIG. 9 is an illustration of a plate-less front face of an example multi-ECU assembly, according to one or more embodiments.
Figure 10:
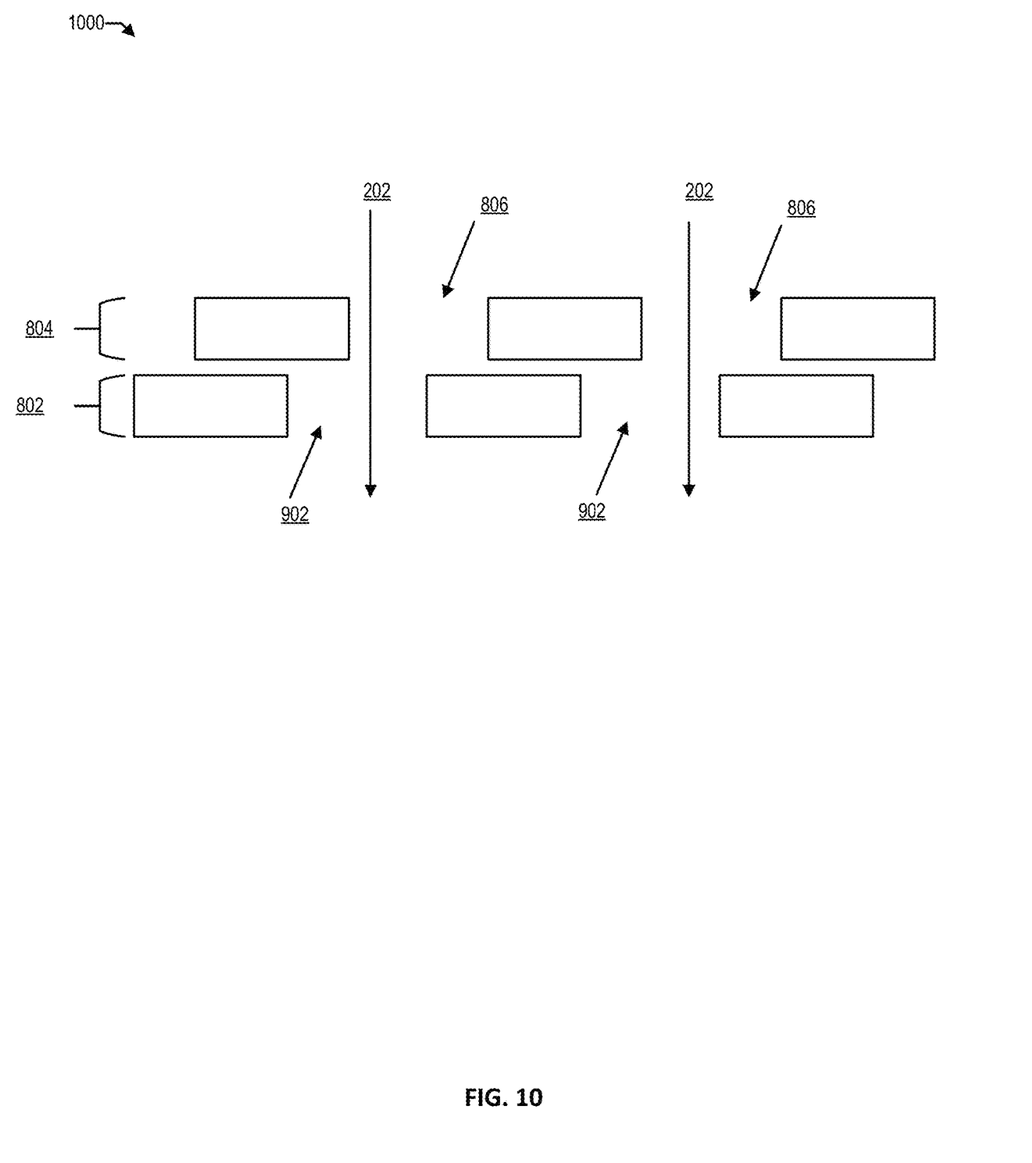
FIG. 10 is an illustration of a cross-section of a front face plate and front face of an example multi-ECU assembly, according to one or more embodiments.

FIGS. 8, 9, and 10 illustrate a front face of a multi-ECU assembly. FIG. 8 is an illustration 800 of a front face and front face plate of an example multi-ECU assembly, according to one or more embodiments. FIG. 9 is an illustration 900 of a plate-less front face of an example multi-ECU assembly, according to one or more embodiments. FIG. 10 is an illustration 1000 of a cross-section of a front face plate and front face of an example multi-ECU assembly, according to one or more embodiments. The front face 802 can be connected to a housing (e.g., housing 104) via a fastener and protect the ECUs from damage and allow air from the ambient environment to reach the ECUs. The front face plate 804 illustrated in FIG. 8 has been removed from the front face 802 in FIG. 9. The front face 802 can include front face vents that, when the front face 802 is connected to a housing (e.g., housing 104) are located proximate to an upper compartment (e.g., upper compartment 106) of the housing. The front face vents 902 can permit air (e.g., air 202) to pass through the front face 802 and into a second inlet (e.g., second inlet 206) of a second ECU (e.g., second ECU 126). The front face vents 902 can further permit air to pass through the front face 802 and into a first air duct (e.g., first air duct 120A) and a second air duct (e.g., second air duct 120B).

In some embodiments, a front face plate 804 can be connected to the front face 802. The front face plate 804 can include front face plate vents 806. The front face plate 804 can be arranged such that the front face plate vent 806 to partially align with the front face vents 902. Referring to FIG. 10, it can be seen that the front face plate 804 partially blocks the flow of air 202 through the front face vents 902.

Figure 11:
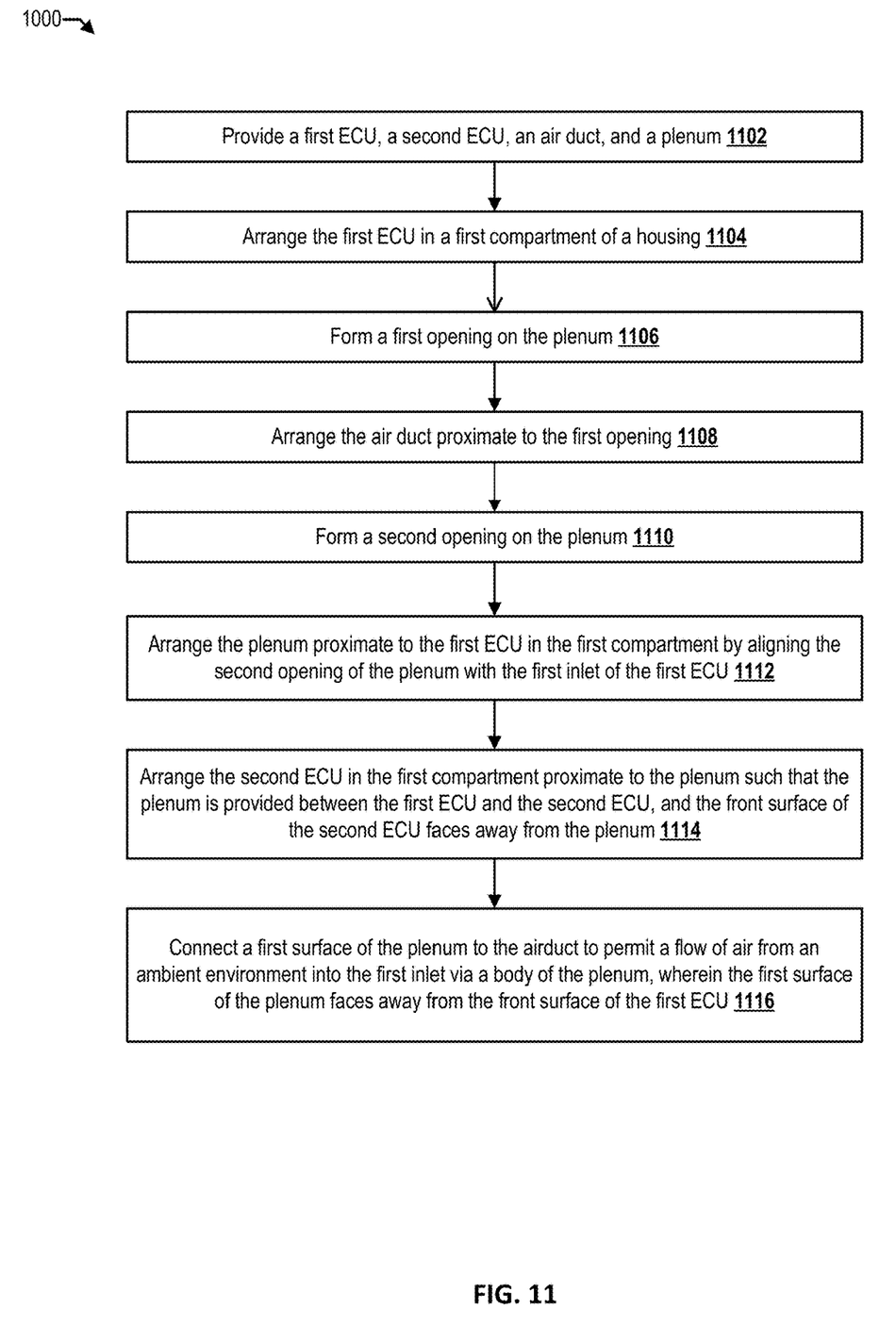
FIG. 11 is an example process flow for assembling an example multi-ECU assembly, according to one or more embodiments.

FIG. 11 is an example process flow 1100 for assembling an example multi-ECU assembly, according to one or more embodiments. At 1102, the method can include providing a first ECU (e.g., first ECU 112), a second ECU (e.g., second ECU 126), an air duct (e.g., air duct 120), and a plenum (e.g., plenum 116).

At 1104, the method can include arranging the first ECU in a first compartment of a housing (e.g., housing 104). The first ECU can be arranged in an upper compartment (e.g., upper compartment 106) resting on a first divider (e.g., first divider 110).

At 1106, the method can include forming a first vent (e.g., first plenum vent 118A). At 1108, the method can include arranging the air duct proximate to the first vent.

At 1110, the method can include forming a second vent (e.g., third plenum vent 210) on the plenum. At 1112, the method can include arranging the plenum proximate to the first ECU in the first compartment by aligning the second vent of the plenum with the first inlet of the first ECU.

At 1114, the method can include arranging the second ECU in the first compartment proximate to the plenum such that the plenum is provided between the first ECU and the second ECU, and the front surface of the second ECU faces away from the plenum.

At 1116, the method can include connecting a first surface of the plenum to the air duct to permit a flow of air from an ambient environment into the first inlet via a body of the plenum, wherein the first surface of the plenum faces away from the front surface of the first ECU. The method can further include attaching a first plate to the housing, wherein the first plate regulates a flow of air from the ambient environment into a second inlet of the second ECU.

The housing described herein permits airflow to at least two fan-cooled ECU units while separating inlet and outlet air from each other, minimizing air recirculation. A removable air duct and plenum allows for easy installation of the housing. The space required for the housing inside the vehicle cabin is minimized by stacking the ECUs one in front of the other.

The above description of certain examples, including illustrated examples, has been presented only for the purpose of illustration and description and is not intended to be exhaustive or to limit the disclosure to the precise forms disclosed. Modifications, adaptations, and uses thereof will be apparent to those skilled in the art without departing from the scope of the disclosure. For instance, any examples described herein, can be combined with any other examples.

Although specific embodiments have been described, various modifications, alterations, alternative constructions, and equivalents are also encompassed within the scope of the disclosure. Embodiments are not restricted to operation within certain specific data processing environments but are free to operate within a plurality of data processing environments. Additionally, although embodiments have been described using a particular series of transactions and steps, it should be apparent to those skilled in the art that the scope of the present disclosure is not limited to the described series of transactions and steps. Various features and aspects of the above-described embodiments may be used individually or jointly.

Further, while embodiments have been described using a particular combination of hardware and software, it should be recognized that other combinations of hardware and software are also within the scope of the present disclosure. Embodiments may be implemented only in hardware, or only in software, or using combinations thereof. The various processes described herein can be implemented on the same processor or different processors in any combination. Accordingly, where components or modules are described as being configured to perform certain operations, such configuration can be accomplished, e.g., by designing electronic circuits to perform the operation, by programming programmable electronic circuits (such as microprocessors) to perform the operation, or any combination thereof. Processes can communicate using a variety of techniques, including but not limited to conventional techniques for inter process communication, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific disclosure embodiments have been described, these are not intended to be limiting. Various modifications and equivalents are within the scope of the following claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments, and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known for carrying out the disclosure. Variations of those preferred embodiments may become apparent to those of ordinary skill in the art upon reading the foregoing description. Those of ordinary skill should be able to employ such variations as appropriate, and the disclosure may be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein.

All references, including publications, patent applications, and patents, cited herein are hereby incorporated by reference to the same extent as if each reference were individually and specifically indicated to be incorporated by reference and were set forth in its entirety herein.

In the foregoing specification, aspects of the disclosure are described with reference to specific embodiments thereof, but those skilled in the art will recognize that the disclosure is not limited thereto. Various features and aspects of the above-described disclosure may be used individually or jointly. Further, embodiments can be utilized in any number of environments and applications beyond those described herein without departing from the broader spirit and scope of the specification. The specification and drawings are, accordingly, to be regarded as illustrative rather than restrictive.

What is claimed is:

1. An assembly, comprising: a housing comprising a first compartment and a plurality of housing vents letting air flow into and out of the housing; a first electronic control unit (ECU) positioned within the first compartment, the first ECU comprising a first inlet letting air flow into the first ECU; a second ECU positioned within the first compartment, the second ECU comprising a second inlet letting air flow into the second ECU; a first plenum positioned in the first compartment, the first plenum positioned between the first ECU and the second ECU, the first plenum comprising a second compartment; and a first air duct forming a first channel letting air into a first plenum vent and into the second compartment, wherein the first plenum vent positioned is to align with the first inlet of the first ECU; a connector attached to the first air duct, wherein the connector is positioned between the first plenum and the second ECU; and a divider separating the first compartment from a third compartment of the housing, wherein the first air duct is positioned adjacent to the divider.

2. The assembly of claim 1, wherein the first ECU further comprises a first outlet letting air to flow out of the first ECU, wherein a position of the first outlet aligns with a position of a first housing vent of the plurality of housing vents.

3. The assembly of claim 1, further comprising: a second air duct attached to the connector, wherein the second air duct is positioned at an opposite end of the connector as the first air duct.

4. The assembly of claim 1, wherein the second ECU further comprises a first outlet letting air flow out of the second ECU, wherein a position of a second housing vent of the plurality of housing vents aligns with a position of the first outlet.

5. The assembly of claim 1, wherein the second ECU comprises a second inlet letting air flow into the second ECU, wherein the housing comprises a second housing vent of the plurality of housing vents positioned to align with a position of the second inlet.

6. The assembly of claim 1, wherein the assembly further comprises a second air duct forming a second channel letting air into a second plenum vent and into the second compartment.

7. The assembly of claim 6, wherein first channel and the second channel let air flow into the second compartment of the first plenum.

8. The assembly of claim 1, wherein the assembly further comprises a third compartment separated from the first compartment by a divider, and wherein the third compartment comprises a power distribution module.

9. The assembly of claim 8, wherein housing comprising a front face, the front face comprising a front face vent.

10. The assembly of claim 1, wherein the assembly further comprises:
 a third ECU positioned within the first compartment, the third ECU comprising a third inlet letting air to flow into the third ECU;
 a second plenum positioned in the first compartment, the second plenum comprising a third compartment, wherein the second plenum is positioned in the first compartment between from the first ECU and the third ECU, and wherein the first ECU is positioned between the third ECU and the second ECU; and
 a second air duct forming a second channel letting air flow into the third compartment.

11. An assembly, comprising: a first electronic control unit (ECU), the first ECU comprising a first inlet letting air flow into the first ECU; a second ECU, the second ECU comprising a second inlet letting air flow into the second ECU; a first plenum comprising a first compartment, the first plenum positioned between the first ECU and the second ECU; a first air duct forming a first channel letting air flow into the first compartment, wherein the first plenum further comprises a first vent positioned to align with a position of the first inlet of the first ECU; a connector attached to the first air duct, wherein the connector is positioned between the first plenum and the second ECU.

12. The assembly of claim 11, wherein the first ECU is attached to the first plenum via a first fastener, and wherein the second ECU is attached to the first plenum via a second fastener.

13. The assembly of claim 11, wherein the first plenum further comprises a second air duct attached to a connector, the second air duct forming a second channel letting air into the first compartment.

14. The assembly of claim 13, wherein the first channel and the second channel let air flow into the first compartment of the first plenum.

15. The assembly of claim 11, wherein the assembly further comprises:
- a third ECU comprising a third inlet letting air to flow into the third ECU;
- a second plenum comprising a second compartment, wherein the second plenum is positioned between from the first ECU and the third ECU, and wherein the first ECU is positioned between the third ECU and the second ECU.

16. The assembly of claim 15, wherein the assembly further comprises
- a second air duct forming a second channel letting air flow into the second compartment.

17. A method of assembling an electronic control unit (ECU) assembly, the method comprising: providing a first ECU, a second ECU, an air duct, and a plenum; arranging the first ECU in a first compartment of a housing; forming a first vent of the plenum; arranging the air duct proximate to the first vent; attaching a connector attached to the first air duct, wherein the connector is positioned between the first plenum and the second ECU; forming a second vent of the plenum; arranging the plenum proximate to the first ECU in the first compartment by aligning the first vent of the plenum with a first inlet of the first ECU; arranging the second ECU in the first compartment proximate to the plenum such that the plenum is provided between the first ECU and the second ECU, and a front surface of the second ECU faces away from the plenum; and connecting a first surface of the plenum to the air duct to permit a flow of air from an ambient environment into the first inlet via a body of the plenum, wherein the first surface of the plenum faces away from the front surface of the first ECU.

18. The method of claim 17, wherein the method further comprises:
- attaching a first plate to the housing, wherein the first plate regulates a flow of air from the ambient environment into a second inlet of the second ECU.

* * * * *